United States Patent [19]

Abe et al.

[11] Patent Number: 5,003,477
[45] Date of Patent: Mar. 26, 1991

[54] DIAGNOSIS SYSTEM FOR A MOTOR VEHICLE

[75] Inventors: Kunihiro Abe; Masanori Sakamoto; Tomoya Kobayashi, all of Tokyo, Japan

[73] Assignee: Fuji Jukogyo Kabushiki Kaisha, Tokyo, Japan

[21] Appl. No.: 306,869

[22] Filed: Feb. 2, 1989

[30] Foreign Application Priority Data

Feb. 18, 1988 [JP] Japan ................. 63-036424

[51] Int. Cl.⁵ ............ G01M 15/00; F02D 41/26; F02P 17/00
[52] U.S. Cl. .................. 364/424.03; 73/117.2; 364/431.01; 364/551.01
[58] Field of Search ............ 364/431.01, 551.01; 73/116, 117.2, 117.3, 119 R, 119 A

[56] References Cited

U.S. PATENT DOCUMENTS

| | | | |
|---|---|---|---|
| 4,527,424 | 7/1985 | Takahashi | 73/119 A |
| 4,694,408 | 9/1987 | Zaleski | 364/551.01 |
| 4,748,843 | 6/1988 | Schäfer et al. | 73/117.3 |
| 4,757,463 | 7/1988 | Ballou et al. | 364/551.01 |
| 4,926,330 | 5/1990 | Abe et al. | 364/424.03 |

FOREIGN PATENT DOCUMENTS

| | | | |
|---|---|---|---|
| 58-12848 | 1/1983 | Japan | 364/551.01 |
| 59-61740 | 4/1984 | Japan | |

*Primary Examiner*—Felix D. Gruber
*Attorney, Agent, or Firm*—Martin A. Farber

[57] ABSTRACT

A system for diagnosing a motor vehicle has a diagnosis device including a computer having a central processing unit and an input/output interface, a first connector for connecting the input/output interface to the control system. A memory cartridge is detachably connected to the diagnosis device through a second connector. First auxiliary terminals are provided on the first connector for connecting the diagnosis device with the control system, and second auxiliary terminals are provided on the second connector. The first auxiliary terminals are connected with the second auxiliary terminals through communication lines provided in the diagnosis device, and the second auxiliary terminals are connected with the input/output interface through communication lines provided in the memory cartridge.

3 Claims, 9 Drawing Sheets

DIAGNOSIS SYSTEM FOR A MOTOR VEHICLE

BACKGROUND OF THE INVENTION

The present invention relates to a trouble diagnosis system for a motor vehicle.

Recently, a motor vehicle has been equipped with an electronic control system for controlling various components of an engine, such as fuel injectors, thereby improving driveability, exhaust gas emission, fuel consumption, and engine power. The electronic control system controls the components based on information represented by output signals from various sensors for detecting engine operating conditions. Accordingly, if malfunctions of components and sensors occur, the engine does not properly operate.

Japanese Patent Application Laid Open 59-61740 discloses a self-diagnosis system where signaling lamps provided on the vehicle are lit or flashed when abnormalities occur in sensors and actuators such as injectors. However, the nature of the defective condition of the sensors and actuators cannot be known only by the lit or flashing lamps. Accordingly, a trouble diagnosis device for easily checking the electronic control system should be provided as equipment in an auto shop.

Japanese Patent Application Laid-Open 58-12848 discloses a diagnosis system in which a checking device is provided for measuring the pulse duration of fuel injection and an engine speed, and for checking whether idling speed is normal.

However, the system is provided for diagnosing only a designated type of motor vehicle by using an exclusive checking device.

In order to diagnose various vehicles, it is necessary to provide several types of checking devices corresponding to respective types of motor vehicles.

Figure 6:
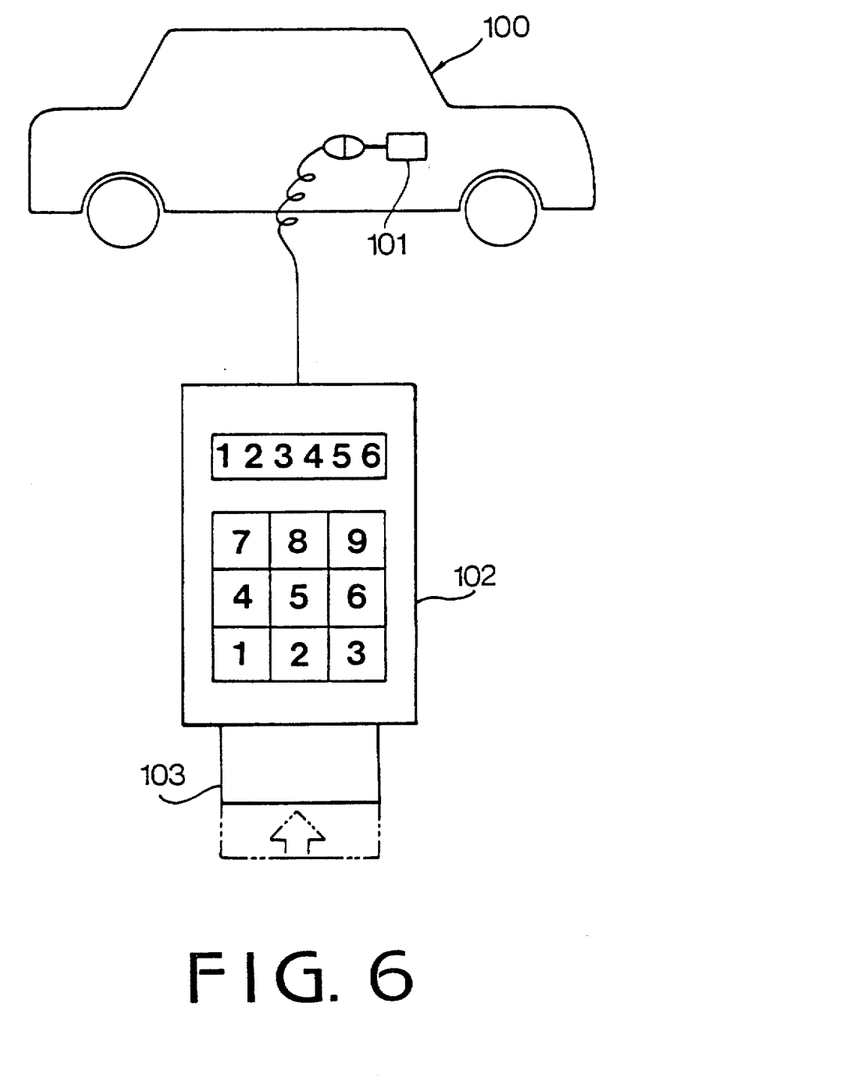
FIG. 6 shows a conventional diagnosis system.

FIG. 6 shows a recently proposed diagnosis system which comprises a diagnosis device 102 and a memory cartridge 103 detachably attached to the device 102. The memory cartridge 103 has a memory such as a ROM for storing diagnosis programs and fixed data for the type and the model year of a vehicle 100. Various cartridges 103 (only one being illustrated) for all vehicle types are provided and the cartridge for the presented vehicle is selected and attached to the diagnosis device 102. A two-way communication between the cartridge 103 and an electronic control system 101 on the vehicle 100 is performed for diagnosing the electronic control system.

However, since the program stored in the fixed capacity ROM of the cartridge in the system can not be expanded for additional functions, if additional sensors and actuators are mounted on the motor vehicle, the control system can not diagnose the additional equipment. Further, in the case where a plurality of input signals from the control system must be simultaneously calculated and treated by the diagnosis device, such operations can not be performed by a single device, even if the memory cartridge is changed. Further, there is a weakness in that if the two-way communication system between the control system and the diagnosis device is changed, the diagnosis device can not diagnose it.

SUMMARY OF THE INVENTION

The object of the present invention is to provide a diagnosis system for a motor vehicle in which diagnosing capacity may be easily expanded, even if the electronic control system and the diagnosis system of a motor vehicle are changed.

According to the present invention, there is provided a system for diagnosing an electronic control system for controlling an engine mounted on a vehicle, comprising a diagnosis device including a computer having a control unit, an input/output interface, a first connector for connecting the input/output interface to the control system, and display means for displaying the results of diagnosis, a memory cartridge detachably connected to the diagnosis device through a second connector, and having a memory storing a plurality of programs for diagnosing the electronic system, first auxiliary terminals provided on the first connector for connecting the diagnosis device with the control system, second auxiliary terminals provided on the second connector, first communication lines provided in the diagnosis device for connecting the first auxiliary terminals with the second auxiliary terminals, and second communication lines provided in the memory cartridge for connecting the second auxiliary terminals with the input/output interface.

The other objects and features of this invention will become understood from the following description with reference to the accompanying drawings.

DETAILED DESCRIPTION OF THE PREFERRED EMBODIMENTS

Figure 1:
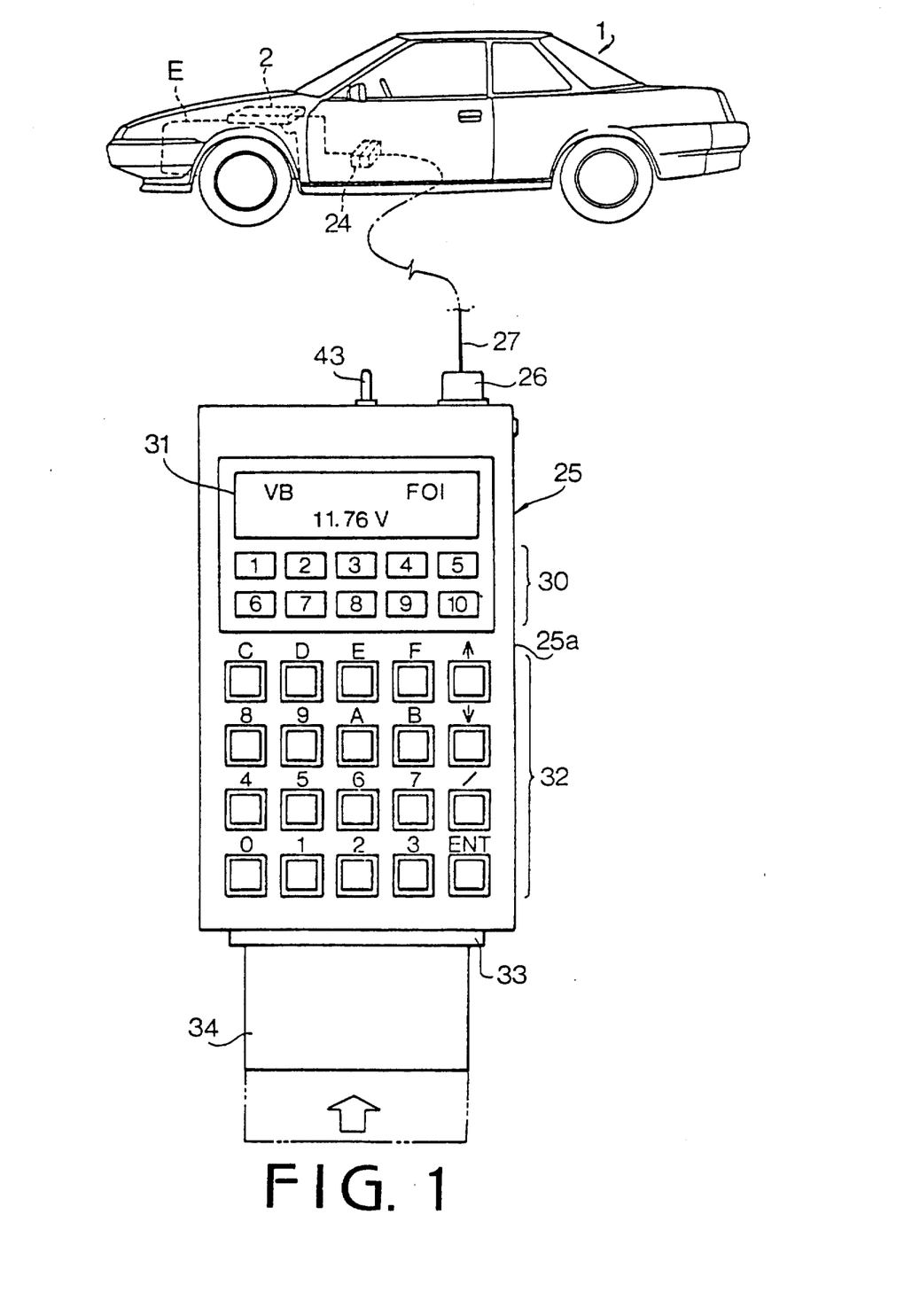
FIG. 1 is a schematic illustration of a diagnosis system according to the present invention.

Referring to FIG. 1, an automobile 1 is equipped with an electronic control system 2 for controlling various components of an engine E. The electronic control system 2 is connected to an external connector 24. A portable diagnosis device 25 comprising a microcomputer has a connector 26, to which the connector 24 of the system 2 is connected through an adapter harness 27.

The diagnosis device 25 has a power switch 43, a liquid crystal display 31, an indicator section 30 consisting of a plurality of LED indicators, and a keyboard 32. A connector 33 is provided for selectively connecting a detachable memory cartridge 34 to the diagnosis device 25.

Figure 2A:
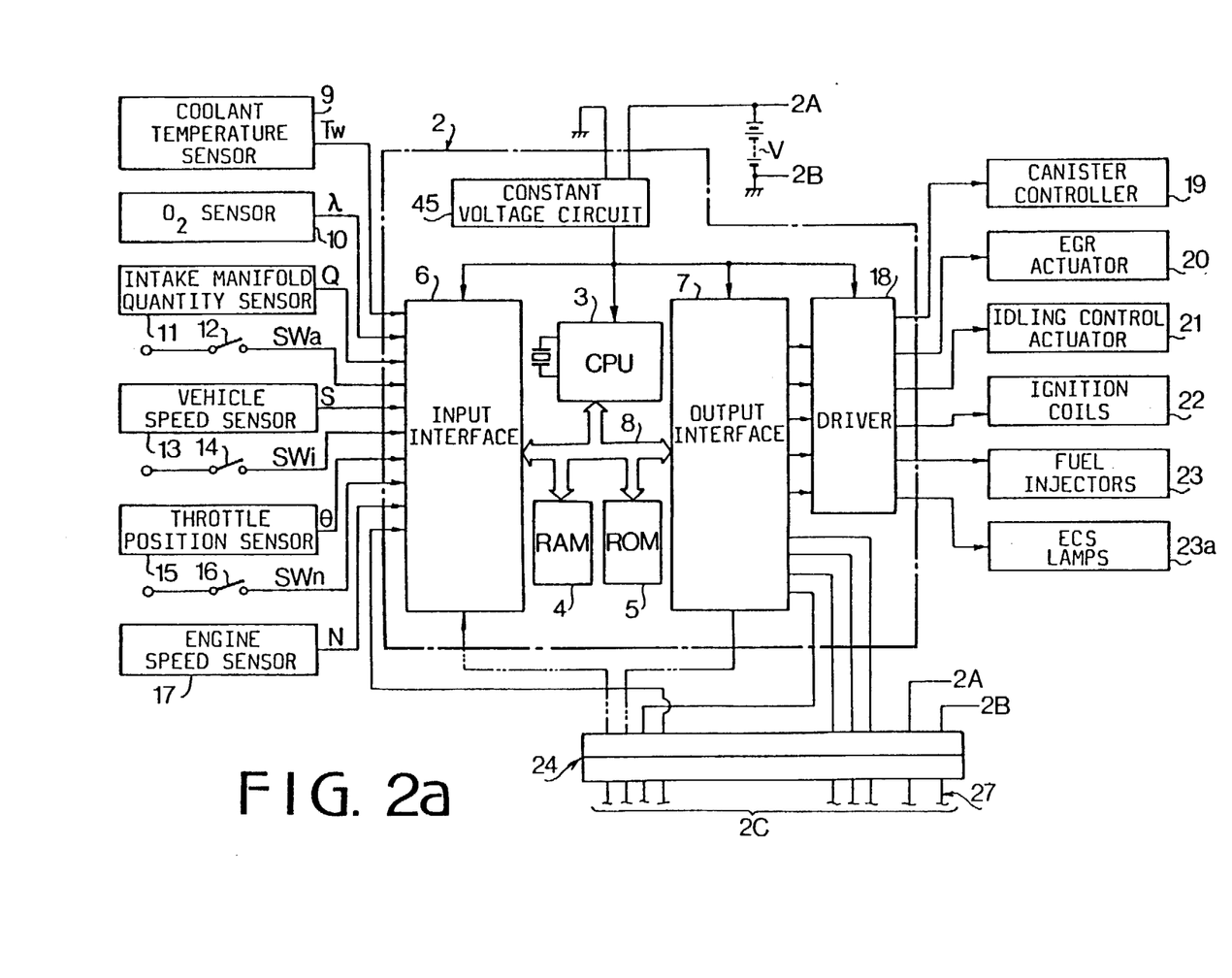
FIGS. 2a to 2c show a block diagram of the system.
Figures 2B, 2C:
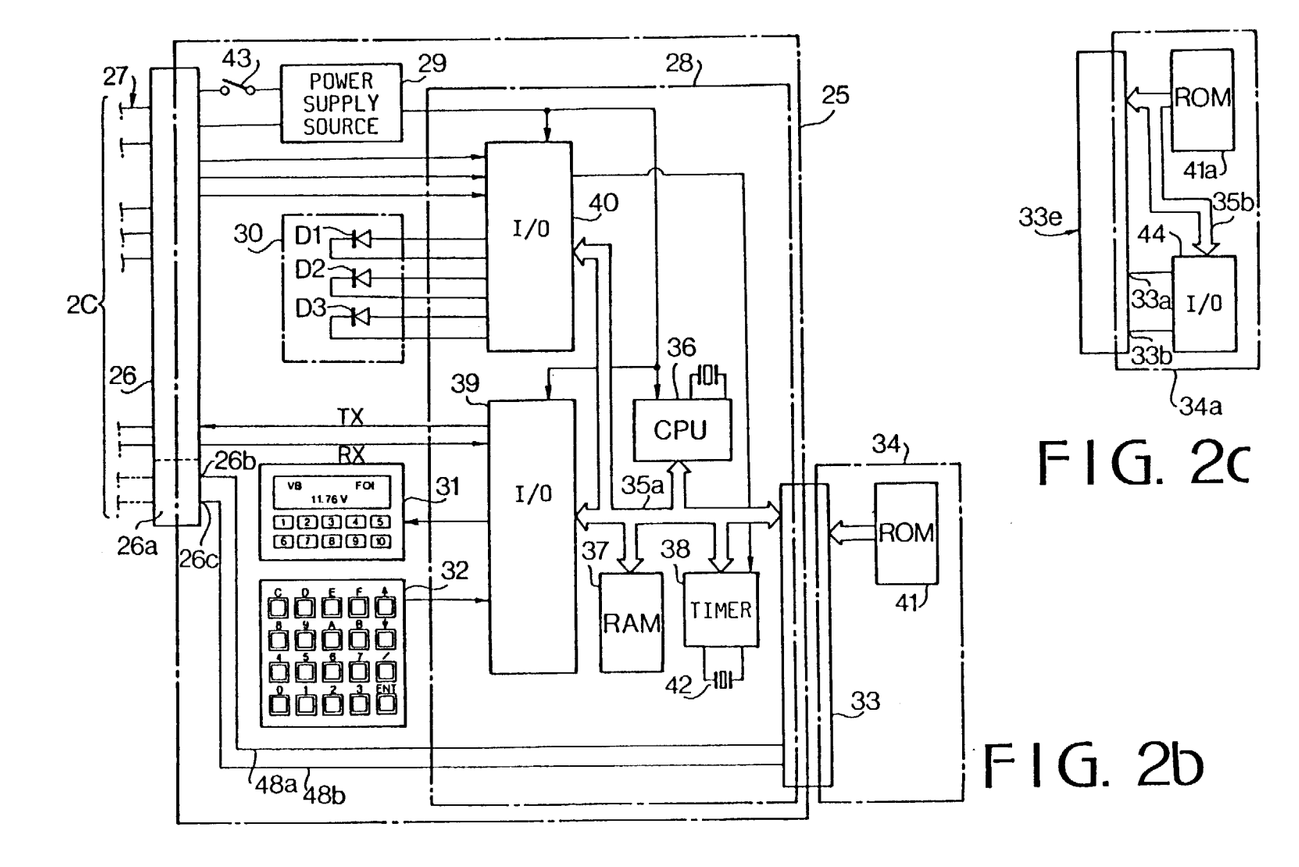

Referring to FIGS. 2a and 2b, the electronic control system 2 comprises a central processor unit (CPU) 3, a random access memory (RAM) 4, a read only memory (ROM) 5, an input interface 6 and an output interface 7. These elements namely the CPU 3, RAM 4, ROM 5, input and output interfaces 6 and 7 are connected to each other through a bus line 8. Programs and data for controlling the engine are stored in the ROM 5. Power is supplied to the CPU 3, input and output interfaces 6 and 7, and driver 18 from a source V through a constant voltage circuit 45.

The input interface 6 is applied with a coolant temperature signal Tw from a coolant temperature sensor 9, an air-fuel ratio feedback signal λ from an O₂ sensor 10, an intake-air quantity signal Q from an intake manifold pressure sensor 11, an air conditioner operating signal SWa from an air conditioner switch 12, a vehicle speed signal S from a vehicle speed sensor 13, an idling signal SWi from an idle switch 14, a throttle valve opening degree signal θ from a throttle position sensor 15, a neutral positioning signal SWn from a neutral switch 16 in a transmission, and an engine speed signal N from an engine speed sensor 17.

These signals are stored in the RAM 4 after processing data in accordance with the program stored in the ROM 5. The CPU 3 produces respective control signals, which are applied to the driver 18 through the output interface 7. The driver 18 produces signals for controlling a canister controller 19 of a fuel-vapor emission control system, an EGR (exhaust gas recirculation system) actuator 20, an idling control actuator 21, ignition coils 22, and fuel injectors 23.

The driver 18 further applies signals to lamps 23a. The lamps 23a are provided in the electronic control system 2 for indicating an abnormality in the system 2. When an abnormality is detected in the system 2 by a self-diagnosis function, a corresponding trouble code is read out from the ROM 5 so as to turn on or flash a plurality of the lamps 23a, thereby indicating the trouble code.

The diagnosis device 25 has a control unit 28 and a power supply source 29. The control unit 28 comprises a CPU 36, a RAM 37, a timer 38 consisting of a counter, and input/output (I/O) interfaces 39 and 40. These elements are connected to each other through a bus line 35a. A clock pulse generator 42 is provided for generating synchronizing pulses to be fed to the timer 38. A ROM 41 provided in the memory cartridge 34 is connected to the bus line 35a through the connector 33. The ROM 41 stores a plurality of programs for diagnosing a plurality of types of control systems 2. Inputs of the I/O interface 40 are connected to the output interface 7 of the control system 2 through connectors 24 and 26 and harness 27. Outputs of the I/O interface 40 are connected to the indicator section 30 and the timer 38. In accordance with on/off operations of switches, corresponding LEDs in the indication section 30 emit light for confirming the operation of each switch. Inputs of the I/O interface 39 are connected to the keyboard 32 for being applied with a mode select signal dependent on the operation of the keyboard, and to the output interface 7. Outputs of the interface 39 are connected to the input interface 6 and the display 31. The power source 29 for supplying the power to the CPU 36 and I/O interfaces 39 and 40 is connected to the source V through the power switch 43.

In accordance with the present invention, the connector 26 has an auxiliary terminal section 26a. Terminals 26b and 26c of the connector 26 are connected to the input and output interfaces 6 and 7 of the control system 2. Terminals of the receptacle of the connector 26 are directly connected to the receptacle of the connector 33 through a pair of communication lines 48a and 48b.

In accordance with the present invention, other memory cartridges are provided FIG. 2c shows an example of a memory cartridge 34a. The memory cartridge 34a is provided with a ROM 41a and an I/O interface 44 connected to each other through a bus line 35b. The ROM 41a stores a diagnosis program for diagnosing another type of control system 2.

Terminals 33a and 33b of a connector 33e are provided to be connected to the lines 48a and 48b through terminals of the receptacle of the connector 33. Further, the terminals 33a and 33b are connected to the I/O interface 44. The bus line 35a and the bus line 35b are connected with each other through the connector 33.

The auxiliary terminal section 26a may be arranged to be separated from the body of the connector 26.

Before performing the diagnosis program, the control system 2 is connected to the diagnosis device 25 through the harness 27 and the selected cartridge corresponding to the control system 2 is attached to the diagnosis device 25.

Figure 3:
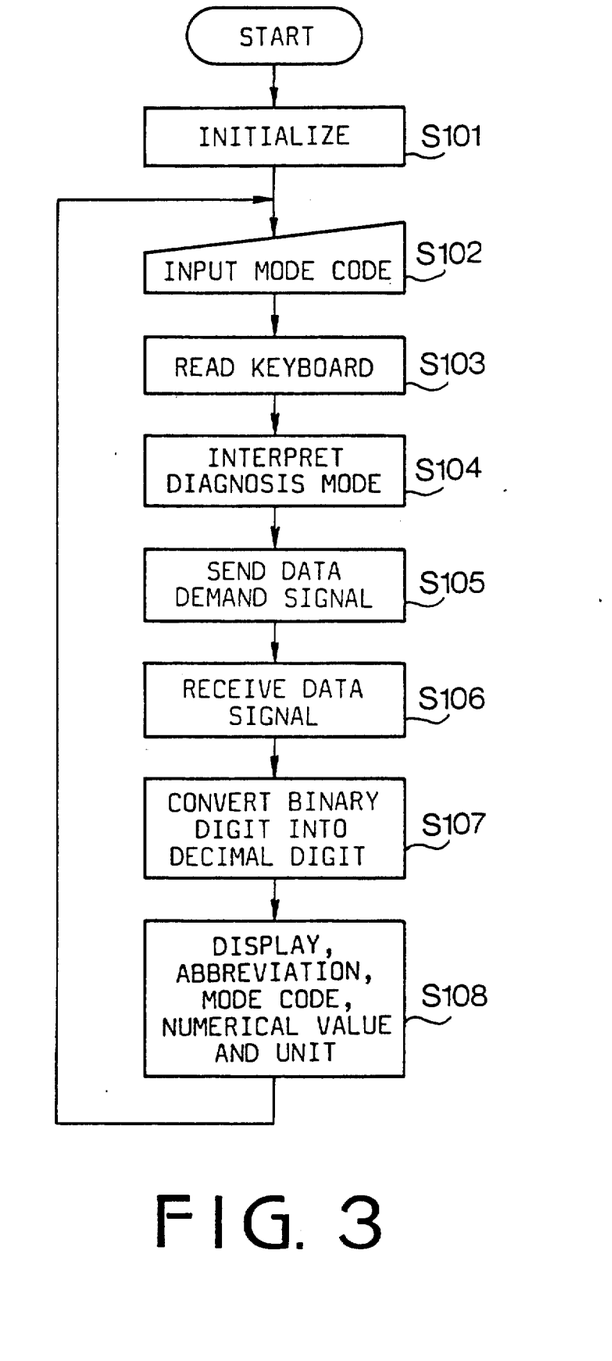
FIG. 3 is a flowchart showing an operation of the system.

The operation of the system is described hereinafter with reference to the flowchart of FIG. 3. The engine is started, and the following diagnosis program is performed under the running condition of the engine.

The power switch 43 is turned on and initialization of the control unit 28 is performed at a step S101. A diagnostician operates the keyboard 32 to select a diagnosis mode and input a mode code of the diagnosis mode (step S102). For example, when checking battery voltage, a mode code F01 for battery voltage checking is input by operating the keyboard 32. The mode code is temporarily stored at a predetermined address in the RAM 37. At steps S103 and S104, the mode code is read out and interpreted.

A data demand signal TX depending on the selected mode is applied to the control system 2 at a step S105. At a step S106, a diagnosis data signal RX in binary digits representing the battery voltage is applied to the control unit 28 from the control system 2. At a step S107, the received binary digits are converted into decimal digits representing the battery voltage, and stored in the RAM 37. At a step S108, an abbreviation VB of the battery voltage and the mode code and units stored at step S102 and the diagnosis data in decimal digits stored at the step S107 are read out and applied to the display 31. Accordingly, the abbreviation VB, the mode code F01, the battery voltage (for example 11.76 volts) and the units V for voltage are displayed on the display 31 as shown in FIG. 1.

In the case that the control system has additional sensors or actuators beyond the capacity of the diagnosis device, which are, for example, provided in a change of model another memory cartridge 34a shown in FIG. 2c is attached to the diagnosis device 25, and the auxiliary terminals are used. The ROM 41a stores an additional program for diagnosing the additional components and the I/O interface 44 has a necessary device (for example, a surge absorbing circuit), if necessary. Thus, the CPU 36 operates to produce a data demand signal and to process a signal from the control system 2 through the lines 48a and 48b.

It is also possible to apply a plurality of data from the control system 2 to the diagnosis device 25 and to calculate data in the device 25.

In the case the motor vehicle has different types of the sensors and actuators so that I/O interfaces 39 and 40 in the device 25 can not process signals, diagnosis can be performed by changing the memory cartridge.

When a communication system for a trouble code data signal in the control system 2 is changed so that the diagnosis device 25 can not diagnose the control system 2, another memory cartridge having a corresponding program and a device for synchronizing trouble code signals with the diagnosis device 25 are used.

When it is necessary to add other components or to expand functions in the device 25, for example, in order to produce a signal for copying a diagnosis report, the expansion of functions of the device 25 is easily achieved by changing the cartridge 34.

Figure 4A:
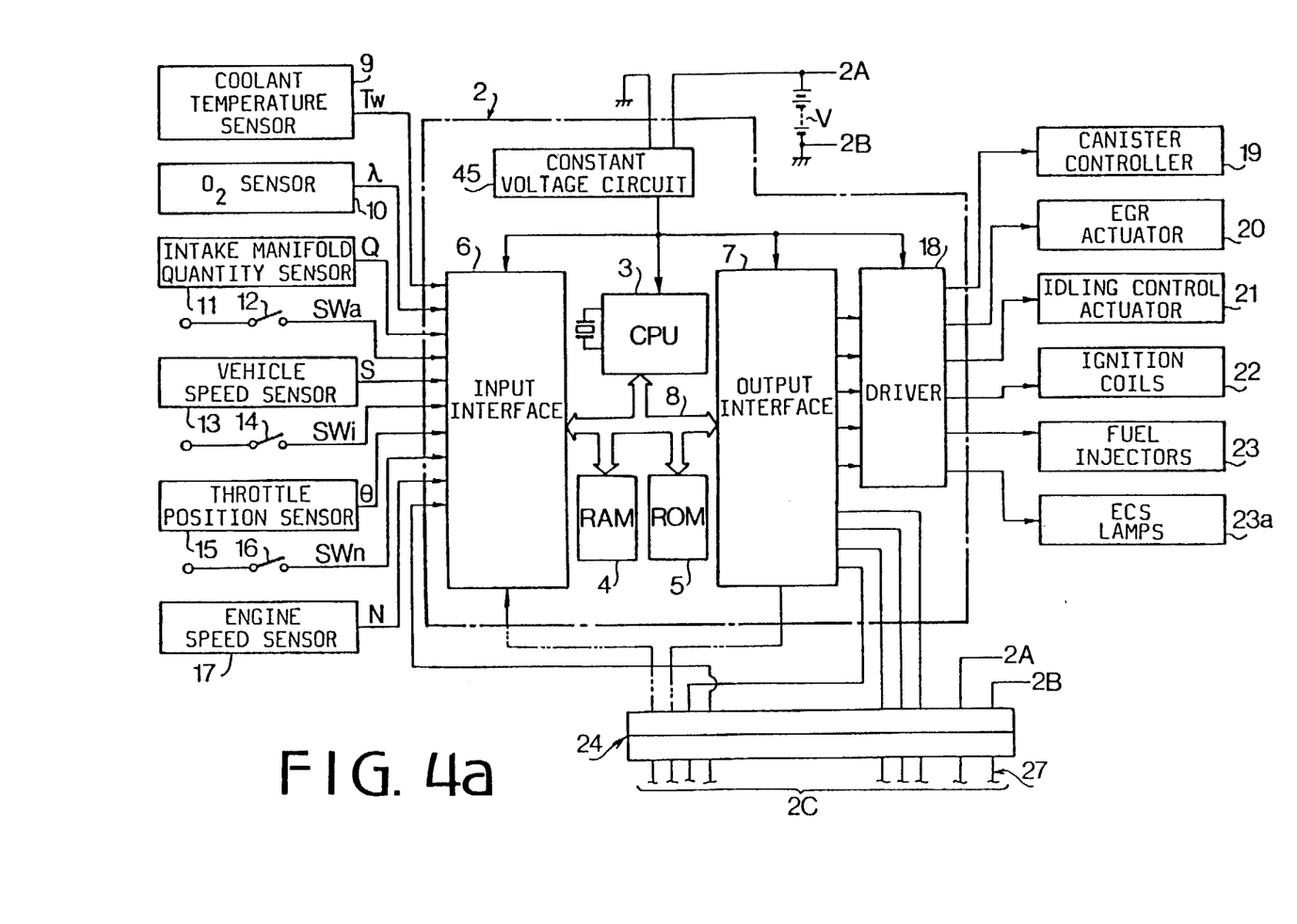
FIGS. 4a and 4b show a block diagram of a second embodiment of the present invention.
Figure 4B:
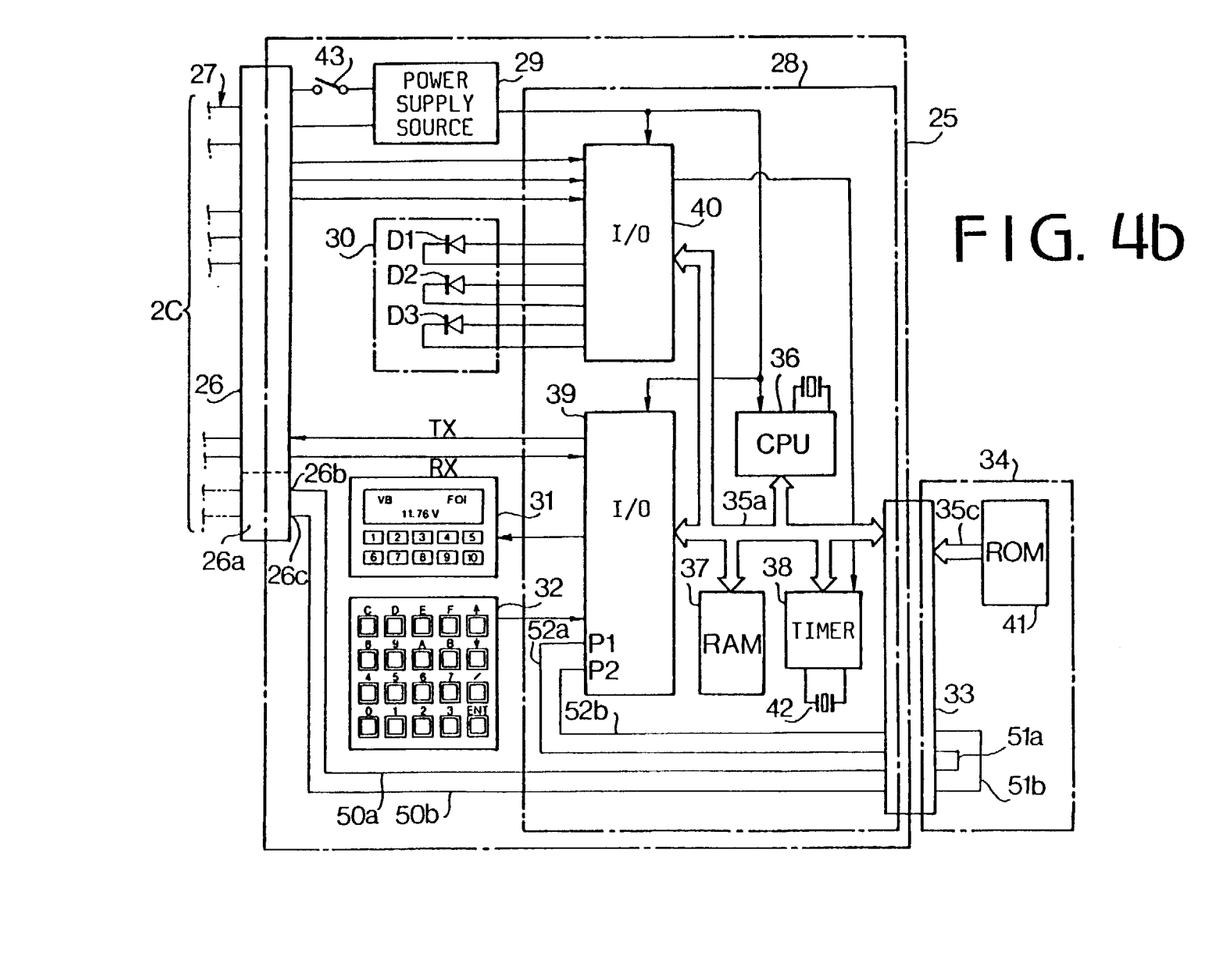

Referring to FIGS. 4a and 4b showing a second embodiment of the present invention, in the device 25, a pair of communications lines 50a and 50b from the auxiliary terminals 26b and 26c are connected to the connector 33, and other communication lines 52a and 52b are connected between the I/O interface 39 and the connector 33. The lines 52a and 52b are connected to an input terminal P1 and an output terminal P2 provided in the I/O interface 39. A pair of communication lines 51a and 51b are provided in the cartridge 34.

When the cartridge 34 is attached to the connector 33, the communication lines 50a and 50b are respectively connected to the input terminal P1 and output terminal P2 through the communication lines 51a and 51b, and communication lines 52a and 52b. The ROM 41 in the cartridge 34 is connected to the connector 33 through a bus line 35c.

Communications between the diagnosis device 25 and the control system 2 are performed through lines 50a and 50b, connector 33, lines 51a, 51b, 52a and 52b. Thus, additional components can be diagnosed.

If the communication system in the control system 2 is changed (for example, change of a data format), the diagnosis is performed by changing the program in the ROM 41. The data demand signal to the control system 2 is applied to the input interface 6 from the output terminal P2 of the I/O interface 39 through communication lines 52b, 51b, and 50b, and the terminal section 26a.

Figure 5A:
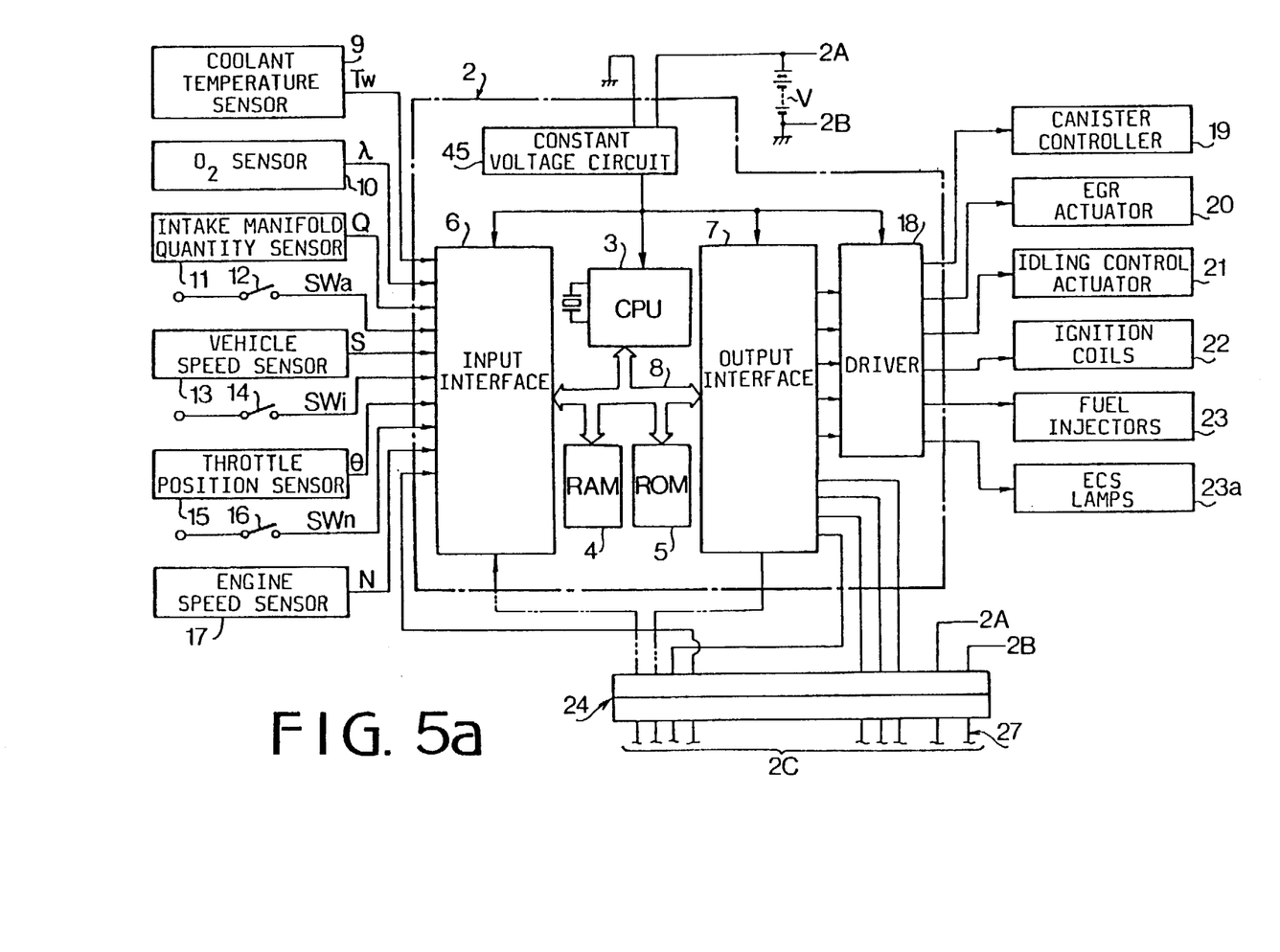
FIGS. 5a and 5b show a block diagram of a third embodiment of the present invention.
Figure 5B:
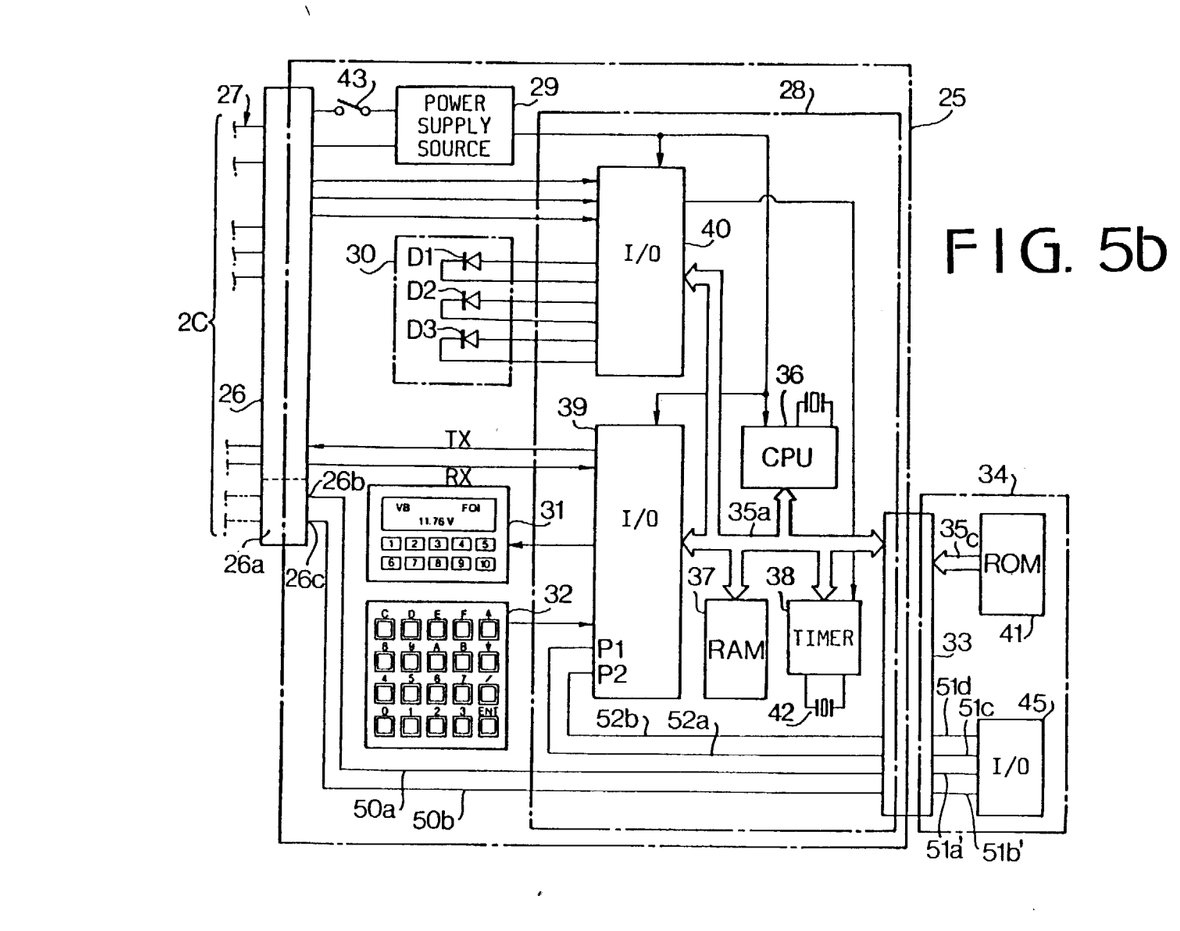

Referring to FIGS. 5a and 5b showing a third embodiment of the present invention, the cartridge 34 has an I/O interface 45. I/O interface 45 is connected to the auxiliary terminal section 26a through communication lines 51a' 51b' 50a and 50b, and to the terminals P1 and P2 of the I/O interface 39 through communication lines 51c, 51d 52a and 52b. Thus, the same operation and effect as the previous embodiments are performed.

In accordance with the present invention, the diagnosis system is provided with auxiliary terminals and a detachable memory cartridge connected to the auxiliary terminals. Thus, diagnosis for various types of control systems and expansion of functions for the diagnosis system can be easily accomplished by changing the memory cartridge.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. A system for diagnosing an electronic control system for controlling an engine mounted on a vehicle, comprising:
   a diagnosis device including a computer having a control unit, an input/output interface, a first connector for connecting the input/output interface to the control system, a second connector, and display means for displaying results of diagnosis;
   a memory cartridge detachably connected to the diagnosis device through the second connector and having a memory storing a plurality of programs for diagnosing the electronic system;
   first auxiliary terminals provided on the first connector for connecting the diagnosis device with the control system;
   second auxiliary terminals provided on the second connector for connecting the diagnosis device with the cartridge;
   communication lines provided in the diagnosis device for connecting the first auxiliary terminals with the second auxiliary terminals to couple signals between said memory cartridge and said control system of the engine, said memory cartridge applying signals to both said engine control system and said diagnosis device to conform a test procedure of said engine control system with a test procedure of said diagnostic device.

2. The system according to claim 1, wherein the memory cartridge has an input/output interface.

3. In a diagnosis system for an electronic control system mounted on a motor vehicle having sensing means including switches for detecting operating conditions of the vehicle, means for storing output data from said sensing means and providing control data for controlling the vehicle, diagnosis means responsive to said at least one of said control and output data for diagnosing said at least one data and for providing diagnosis data, display means for displaying said diagnosis data, a keyboard for inputting a mode code of a diagnosis mode into said diagnosis means, a detachable memory cartridge detachably connected to said diagnosis means for storing a plurality of programs for diagnosing said at least one data, connecting means for connecting said diagnosis means with said electronic control system and said detachable memory cartridge which have different types of data signals being transmitted in response to a demand signal, the improvement in the diagnosis system which comprises:
   an input/output interface provided in said diagnosis means to transmit said data signals between said diagnosis means and said detachable memory cartridge;
   a first communication line provided in said diagnosis means for connecting said electronic control system with said input/output interface;
   a second communication line provided in said detachable memory cartridge for connecting said diagnosis means with said detachable memory cartridge;
   said connecting means comprising:
   a first connector interposed between said electronic control system and said diagnosis means for connecting said first communication line with said electronic control system; and
   a second connector interposed between said diagnosis means and said detachable memory cartridge for connecting said second communication line with said input/output interface so as to be able to transmit additional data of said different types of data signals without changing said detachable memory cartridge.

* * * * *